United States Patent
Douence et al.

(10) Patent No.: US 10,574,913 B2
(45) Date of Patent: Feb. 25, 2020

(54) HIGH DYNAMIC RANGE CTIA PIXEL

(71) Applicant: Teledyne Scientific & Imaging, LLC, Thousand Oaks, CA (US)

(72) Inventors: Vincent Douence, Thousand Oaks, CA (US); Mihail Milkov, Moorpark, CA (US)

(73) Assignee: Teledyne Scientific & Imaging, LLC, Thousand Oaks, CA (US)

(*) Notice: Subject to any disclaimer, the term of this patent is extended or adjusted under 35 U.S.C. 154(b) by 222 days.

(21) Appl. No.: 15/698,252

(22) Filed: Sep. 7, 2017

(65) Prior Publication Data

US 2019/0075262 A1 Mar. 7, 2019

(51) Int. Cl.
| | |
|---|---|
| H04N 5/355 | (2011.01) |
| H03F 3/45 | (2006.01) |
| H03G 3/30 | (2006.01) |
| H04N 5/378 | (2011.01) |
| H04N 5/353 | (2011.01) |
| H01L 27/146 | (2006.01) |

(52) U.S. Cl.
CPC ......... *H04N 5/3559* (2013.01); *H03F 3/4521* (2013.01); *H03G 3/3084* (2013.01); *H04N 5/378* (2013.01); *H01L 27/14649* (2013.01); H03F 2203/45186 (2013.01); H04N 5/353 (2013.01)

(58) Field of Classification Search
CPC .... H04N 5/3559; H04N 5/355; H04N 5/3535; H04N 5/378; H04N 5/353; H04N 5/379; H04N 5/3745; H03F 3/4521; H03F 2203/45186; H03F 2203/45201; H03F 2203/45206; H03G 3/3084; H03G 3/30; H01L 27/14649; H01L 27/14643; H01L 27/146

See application file for complete search history.

(56) References Cited

U.S. PATENT DOCUMENTS

| | | | |
|---|---|---|---|
| 4,786,831 A * | 11/1988 | Morse | G01J 5/22 250/338.1 |
| 5,892,540 A | 4/1999 | Kozlowski et al. | |
| 6,252,462 B1 | 6/2001 | Hoffman | |
| 6,697,111 B1 | 2/2004 | Kozlowski et al. | |
| 7,492,399 B1 | 2/2009 | Gulbransen et al. | |
| 7,492,400 B2 | 2/2009 | El Gamal et al. | |
| 7,551,059 B2 | 6/2009 | Farrier | |

(Continued)

*Primary Examiner* — John R Lee
(74) *Attorney, Agent, or Firm* — M. J. Ram and Associates

(57) ABSTRACT

A HDR CTIA pixel which provides automatic gain selection, and spatial and temporal coherence. The pixel comprises an input node for connection to a photocurrent, and an output node. The pixel includes a CTIA which comprises a "high gain" integration capacitor and a first reset switch connected between the input and output nodes, a "low gain" integration capacitor connected between the input node and a first node, a second reset switch connected between the first node and the output node, and a first FET connected across the second reset switch. In operation, the first FET is off during the reset phase, and is conditionally turned on during or after the integration phase. The CTIA also includes an amplifier having an inverting input connected to the input node and an output connected to the output node. The pixel can be operated in "static low-gain control" and "dynamic low-gain control" modes.

32 Claims, 7 Drawing Sheets

(56) References Cited

U.S. PATENT DOCUMENTS

| | | |
|---|---|---|
| 7,586,074 B2 | 9/2009 | Gulbransen et al. |
| 7,830,425 B2 | 11/2010 | Wang et al. |
| 7,995,125 B2 | 8/2011 | Blessinger |
| 9,219,449 B2 | 12/2015 | Yang et al. |
| 2004/0046101 A1* | 3/2004 | Nakamura ........ H01L 27/14643 250/200 |
| 2006/0124830 A1* | 6/2006 | Olsen ........................ H03F 3/08 250/214 A |
| 2009/0091648 A1* | 4/2009 | Lin ........................ H04N 5/335 348/301 |
| 2010/0044552 A1 | 2/2010 | Chen |
| 2011/0068860 A1* | 3/2011 | Baud ........................ G01J 1/46 330/7 |
| 2013/0187028 A1* | 7/2013 | Salvestrini ............. H04N 5/378 250/208.1 |
| 2014/0016027 A1 | 1/2014 | Yang et al. |
| 2015/0192628 A1* | 7/2015 | Becker ...................... G01J 5/22 250/338.4 |
| 2016/0014366 A1 | 1/2016 | Chiaverini et al. |
| 2016/0198101 A1 | 7/2016 | Bagwell et al. |
| 2016/0285419 A1* | 9/2016 | Milkov ................ H04N 5/3745 |
| 2019/0075262 A1* | 3/2019 | Douence ............. H04N 5/3745 |

* cited by examiner

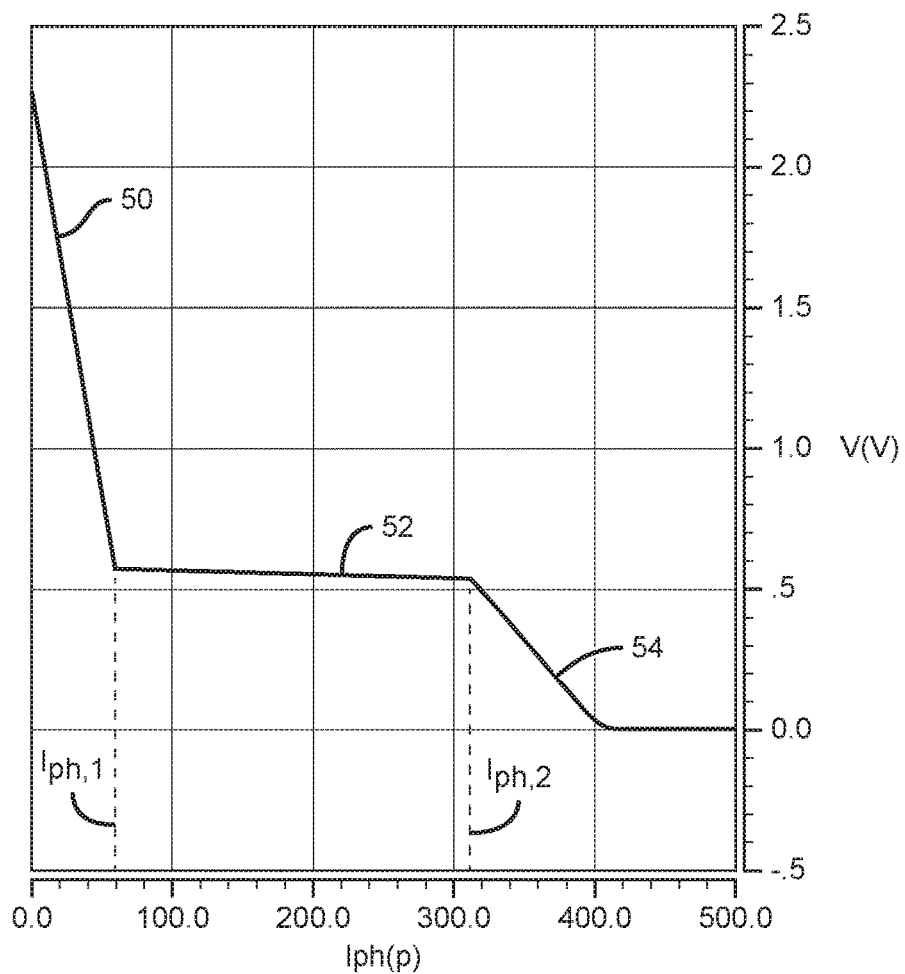
FIG. 2
FIG. 3a
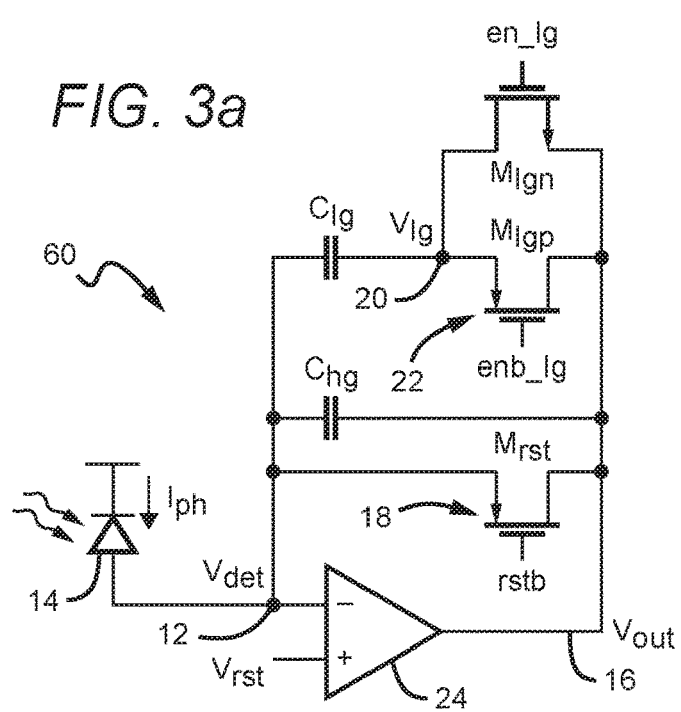

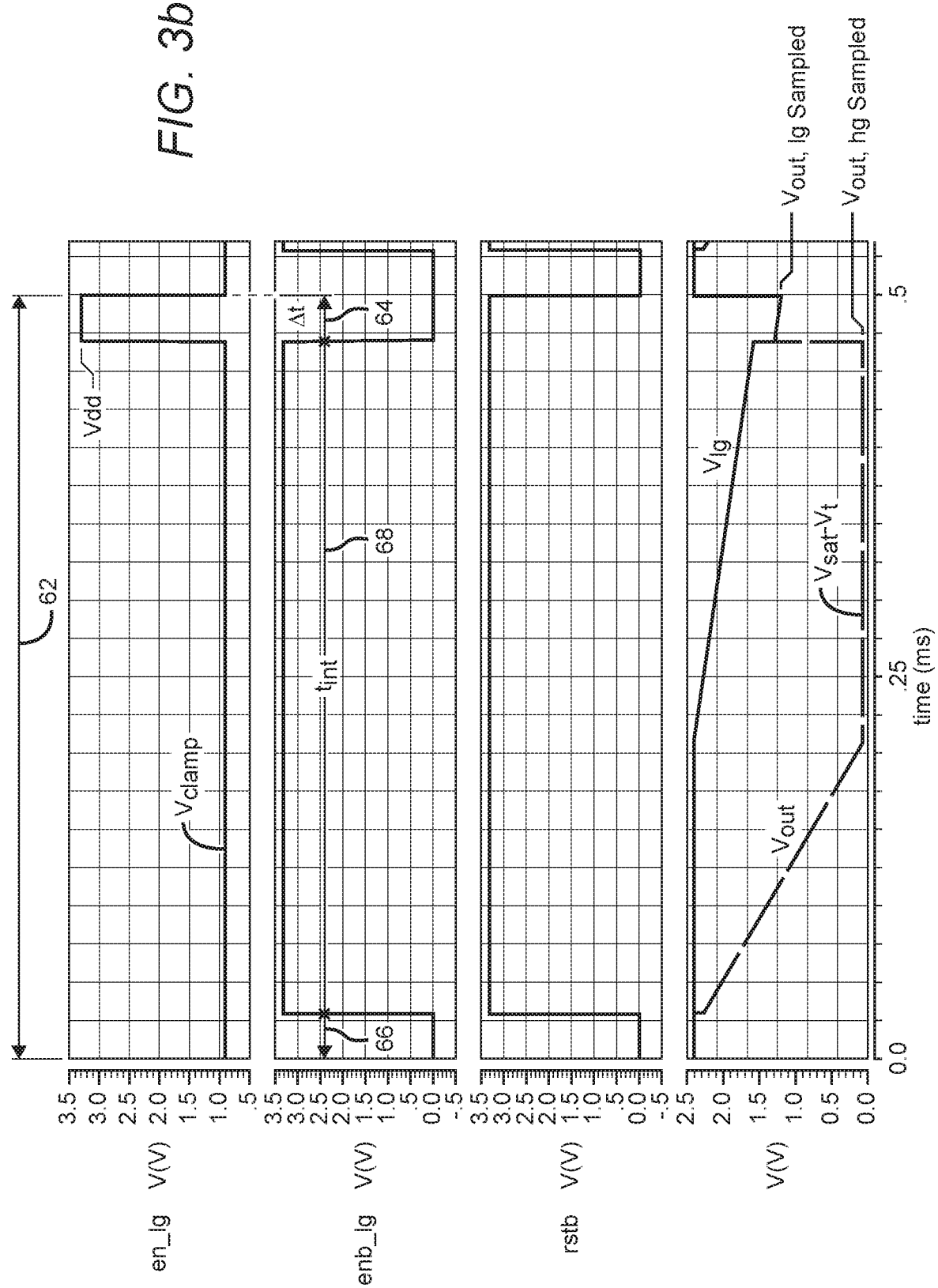

HIGH DYNAMIC RANGE CTIA PIXEL

BACKGROUND OF THE INVENTION

Field of the Invention

This invention relates generally to pixels, and more particularly to high dynamic range pixels which employ a capacitive transimpedance amplifier.

Description of the Related Art

High dynamic range (HDR) imaging is finding growing applications in many areas. For example, infrared (IR) imaging applications may require the ability to capture scenes with large variations in irradiance due to object temperatures, while also having to deal with undesirable scene disturbances, due to, for example, sun reflection or laser jamming. Another application is hyperspectral imaging, in which an image sensor looks at objects using a vast portion of the electromagnetic spectrum. In many imaging applications and particularly in hyperspectral imaging using spatial scanning, it is desirable or critical to maintain spatial and temporal coherence while capturing an HDR image. Spatial coherence refers to using the same point in the image sensor (in practice, the same photodiode) to capture the HDR signal. For example, an HDR image formed by combining the signals from two adjacent pixels (one optimized for low signal levels and the other optimized for high signal levels) is not spatially coherent because the HDR image is obtained from different points in space. Temporal coherence refers to capturing the HDR signal at the same point in time. For example, an HDR image formed by combining two sequential frames taken at different exposures is not temporally coherent because the two exposures are not simultaneous and consequently the scene might have changed between the first and second exposure.

One approach to an HDR pixel with spatial and temporal coherence is the visible monolithic pixel described in Sugawa et al., "A 100 dB dynamic range CMOS sensor using a lateral overflow integration capacitor", 2005 ISSCC. An overflow capacitor is connected to the floating diffusion node of a standard 4T pixel to collect the overflow charge during integration. However, this pixel requires multiple reads (one before integration and one after integration), and has a reduced fill factor and quantum efficiency (QE) because the photodiode, overflow capacitor and the MOS transistors share the same silicon. Furthermore, this pixel is not suitable for detecting wavelengths greater than 1.1 µm because it uses a silicon photodiode.

With an IR photodetector, a capacitive transimpedance amplifier (CTIA) is often interfaced to the detector and used as an integrator. A small integrating capacitor (known as a high-gain capacitor) can be used to achieve low input-referred noise at the expense of limited well capacity. A large integrating capacitor (known as a low-gain capacitor) can be used to achieve large well capacity at the expense of higher input-referred noise. One known approach to implementing an HDR CTIA pixel with spatial and temporal coherence requires the use of a comparator connected to the CTIA output. The CTIA amplifier has high-gain (HG) and low-gain (LG) capacitors, with the comparator switching the LG capacitor in series with the HG capacitor under specified conditions. However, employing a comparator for every pixel results in extra power consumption and requires a significant amount of layout area.

SUMMARY OF THE INVENTION

A novel HDR CTIA pixel is presented which provides automatic gain selection, as well as both spatial and temporal coherence.

The present pixel has an associated pixel frame period comprising a reset phase followed by an integration phase. In a preferred embodiment, the pixel comprises an input node for connection to the photocurrent output $I_{ph}$ of a photodiode, and an output node at which a voltage $V_{out}$ is provided. The pixel includes a CTIA which comprises a first "high gain" (HG) integration capacitor connected between the input and output nodes, a first reset switch connected between the input and output nodes, a second "low gain" (LG) integration capacitor connected between the input node and a first node, a second reset switch connected between the first node and the output node, and a first FET connected across the second reset switch. In operation, the first FET is off during the reset phase, and is conditionally turned on during or after the integration phase. The first and second reset switches are preferably implemented as FETs of a first polarity (for example, both PMOS), and the first FET is preferably of a second polarity opposite of the first polarity (for example, NMOS). The CTIA preferably also includes an amplifier having at least an inverting input port and an output port, the inverting input port connected to the input node and the output port connected to the output node. A pixel as described herein can be operated in several different ways, including "static low-gain control" and "dynamic low-gain control" modes.

These and other features, aspects, and advantages of the present invention will become better understood with reference to the following drawings, description, and claims.

BRIEF DESCRIPTION OF THE DRAWINGS

FIG. 1b is a timing diagram which illustrates the operation of the HDR CTIA pixel of FIG. 1a.

FIG. 2 is a plot of the CTIA output voltage at the end of integration vs. photocurrent which further illustrates the operation of the HDR CTIA pixel of FIG. 1a.

FIG. 3a is a schematic diagram of another possible embodiment of a HDR CTIA pixel as described herein.

FIG. 3b is a timing diagram which illustrates the operation of the HDR CTIA pixel of FIG. 3a.

FIG. 4 is a plot of the HG and LG CTIA output voltages vs. photocurrent which further illustrates the operation of the HDR CTIA pixel of FIG. 3a.

FIG. 5b is a timing diagram which illustrates the operation of the circuitry shown in FIG. 5a.

FIG. 6b is a timing diagram which illustrates the operation of the circuitry shown in FIG. 6a.

DETAILED DESCRIPTION OF THE INVENTION

Figure 1A:
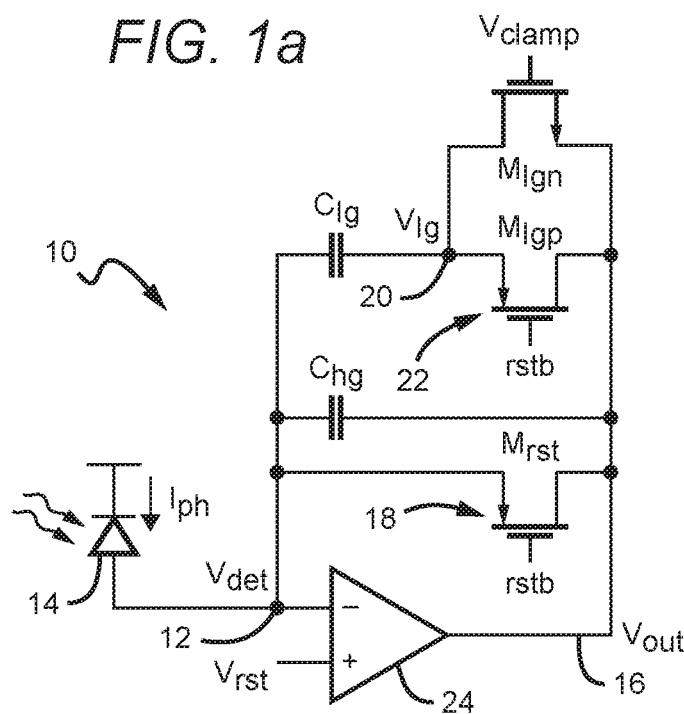
FIG. 1a is a schematic diagram of one possible embodiment of a HDR CTIA pixel as described herein.

One possible embodiment of the present HDR CTIA pixel is shown in FIG. 1a. The pixel has an associated pixel frame period, comprising a "reset phase" followed by an "integration phase". The pixel 10 comprises an input node 12 for connection to the photocurrent output $I_{ph}$ of a photodiode 14, and an output node 16, the voltage at the output node being $V_{out}$. The pixel also includes a CTIA which comprises a first integration capacitor $C_{hg}$ connected between input node 12 and output node 16, and a first reset switch 18 connected across $C_{hg}$. A second integration capacitor $C_{lg}$ is connected between input node 12 and a first node 20, the voltage at first node 20 being $V_{lg}$, and a second reset switch 22 is preferably connected between first node 20 and output node 16. Reset switches 18 and 22 are shown implemented with PMOS FETs $M_{rst}$ and $M_{lgp}$, respectively, though other device types could also be used. The CTIA preferably also comprises an amplifier 24 having at least an inverting input port and an output port, the inverting input port of the amplifier connected to input node 12 and the output port connected to output node 16. Amplifier 24 is a differential amplifier in the exemplary embodiment shown in FIG. 1a, though a single-ended amplifier could also be used.

The present pixel also includes a first FET $M_{lgn}$ connected across second reset switch 22. In operation, first FET $M_{lgn}$ is off during the reset phase, and conditionally turns on during or after the integration phase. First and second reset switches 18, 22 are preferably implemented as FETs of a first polarity, and first FET $M_{lgn}$ is preferably implemented as a FET of a second polarity opposite that of the first polarity. For example, as shown in FIG. 1a, first and second reset switches 18, 22 are implemented as PMOS FETs, and FET $M_{lgn}$ is implemented as a NMOS FET.

Figure 1B:
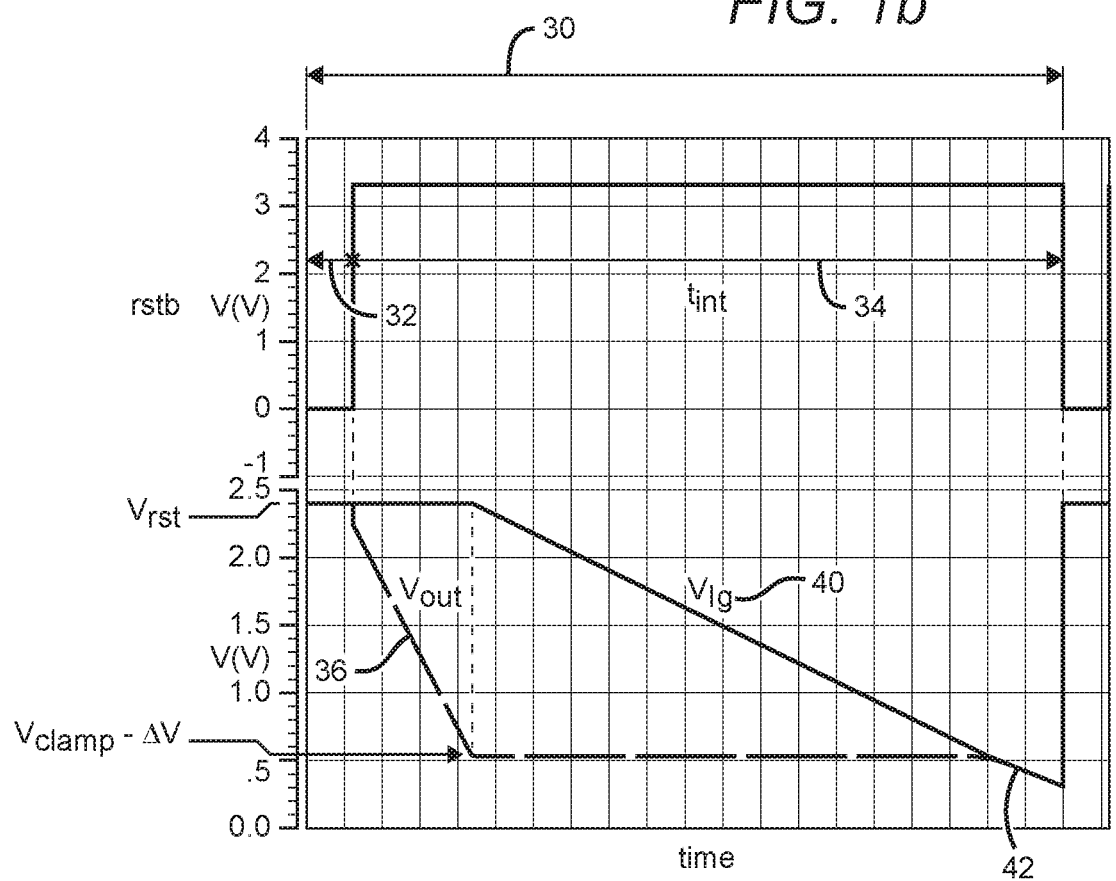

The circuit configuration described above can be operated in several different modes. A "static low-gain control" mode is illustrated in FIG. 1a, with an accompanying timing diagram shown in FIG. 1b. The pixel operation during the frame period 30 proceeds as follows:

first and second reset switches 18, 22 are closed during the reset phase 32 (control signal rstb is at a logic 'low'), and are opened during the integration phase 34 (control signal rstb is at a logic 'high');

first FET $M_{lgn}$ is driven with a DC gate voltage $V_{clamp}$ such that:

$M_{lgn}$ is off during reset phase 32; and $M_{lgn}$ conditionally turns on during the integration phase 34; and $V_{out}$ is sampled just before the end of the integration phase.

The following analysis assumes that $I_{ph}$ flows into node 12, $M_{lgn}$ is an NMOS FET and $0<\Delta V<V_t$, where $V_t$ is the NMOS threshold voltage:

During the reset phase 32, $M_{rst}$ and $M_{lgp}$ are on and $V_{out}$ and $V_{lg}$ are reset to a predetermined voltage. In a region 36, $M_{lgn}$ is off and photocurrent $I_{ph}$ is integrated only on $C_{hg}$. As a result, $V_{out}$ decreases with time with a slope $-I_{ph}/C_{hg}$. When $V_{out}=V_{clamp}-\Delta V$, $M_{lgn}$ turns on in weak inversion and operates in saturation. Now $V_{out}$ is constant and clamped at $V_{clamp}-\Delta V$, no current flows through $C_{hg}$, and $I_{ph}$ is integrated entirely on $C_{lg}$. Consequently, in this region 40, $V_{lg}$ decreases with time with a slope $-I_{ph}/C_{lg}$. Then, when $V_{lg}=V_{out}=V_{clamp}-\Delta V$, $M_{lgn}$ begins to operate in the linear region as a switch that is closed and $V_{out}$ is unclamped. In this region 42, $I_{ph}$ is integrated on both $C_{hg}$ and $C_{lg}$ and $V_{out}=V_{lg}$ and decreases with time with a slope $-I_{ph}/(C_{hg}+C_{lg})$.

Note that the CTIA can be single-ended or differential (as shown in FIG. 1a). If differential, the predetermined voltage is equal to a voltage $V_{rst}$ applied to the non-inverting input of CTIA amplifier 24. When the CTIA is single-ended and $I_{ph}$ flows into node 12, the predetermined voltage is preferably set approximately a PMOS threshold voltage below the supply voltage Vdd. When the CTIA is single-ended and $I_{ph}$ flows out of node 12, the predetermined voltage is preferably set approximately a NMOS threshold voltage above ground.

If $I_{ph}$ flows out of node 12, $M_{lgn}$ is a PMOS FET and $0<\Delta V<|V_t|$, where $V_t$ is the PMOS threshold voltage, the pixel operation is similar to the one described above except that:

$V_{out}$ is reset to a predetermined voltage during the reset phase 32 and increases with time during the integration phase 34;

$M_{lgn}$ is off during integration phase 34 while $V_{out}<V_{clamp}+\Delta V$ and $M_{lgn}$ is on during integration phase 34 while $V_{out}>V_{clamp}+\Delta V$.

A plot of the sampled value of $V_{out}$ at the end of integration phase 34 versus $I_{ph}$ for the "static low-gain control" mode is shown in FIG. 2. In this plot it is assumed that $I_{ph}$ flows into node 12 and $M_{lgn}$ is an NMOS FET. There are three distinct regions, with the behavior of $V_{out}$ depending on the magnitude of $I_{ph}$. In HG linear region 50, $V_{out}$ decreases linearly with photocurrent $I_{ph}$ and is inversely proportional to $C_{hg}$:

$$V_{out} = V_{rst} - \frac{I_{ph}t_{int}}{C_{hg}},$$

where $t_{int}$ is the integration time.

$V_{out}$ is in logarithmic region 52 when $I_{ph}$ is greater than $$I_{ph,1} = \frac{C_{hg}\Delta V_{out}}{t_{int}}$$

but less than $$I_{ph,2} = \frac{(C_{hg} + C_{lg})\Delta V_{out}}{t_{int}},$$

where $\Delta V_{out}=V_{rst}-V_{clamp}+\Delta V$. In logarithmic region 52 $V_{out}$ is essentially independent of the values of $C_{hg}$ and $C_{lg}$, and decreases logarithmically with $I_{ph}$:

$$V_{out} = V_{clamp} - \Delta V = V_{clamp} - \frac{nkT}{q}\ln\frac{I_{ph}}{I_0},$$

where k is Boltzmann's constant, T is absolute temperature, q is the charge of the electron, n is a non-ideality factor, and $I_0$ is current proportional to W/L of $M_{lgn}$.

When $I_{ph}$ is greater than $I_{ph,2}$, $V_{out}$ is in LG linear region 54, in which $V_{out}$ decreases linearly with photocurrent and is inversely proportional to the sum of $C_{hg}$ and $C_{lg}$:

$$V_{out} = V_{rst} - \frac{I_{ph}t_{int}}{C_{hg} + C_{lg}}$$

As $I_{ph}$ increases further, $V_{out}$ ($I_{ph}$) approaches zero and the CTIA pixel saturates. This occurs for approximately 400 pA in FIG. 2.

For reference, the following parameters were used in creating the plot shown in FIG. 2:

$C_{hg}$=16 fF
$C_{lg}$=64 fF
$V_{clamp}$=0.9 V
$t_{rst}$=30 μs
$t_{frame}$=500 μs
$t_{int}$=470 μs If $I_{ph}$ flows out of node 12 and $M_{lgn}$ is a PMOS FET, the behavior of $V_{out}$ as a function of photocurrent $I_{ph}$ and the associated equations are similar, except that $V_{out}$ increases with $I_{ph}$ during first linear region 50, logarithmic region 52 and second linear region 54.

Another possible operating mode, referred to herein as "dynamic low-gain control", is illustrated in FIG. 3a, with an accompanying timing diagram shown in FIG. 3b. The pixel 60 has the same circuit elements as did pixel 10. However, rather than first FET $M_{lgn}$ being driven with a constant voltage $V_{clamp}$, it is instead controlled with a signal en_lg which toggles between $V_{clamp}$ and a full-rail voltage (Vdd if $M_{lgn}$ is an NMOS FET) as shown in FIG. 3b. In addition, second reset switch 22 (PMOS FET $M_{lgp}$) is controlled with a control signal enb_lg, rather than reset signal rstb.

Pixel frame period 62 further comprises a charge redistribution phase 64 following the reset phase 66 and integration phase 68. The pixel frame period 62 is arranged such that:
first and second reset switches 18, 22 are closed during reset phase 66;
first and second reset switches 18, 22 are opened during integration phase 68;
first reset switch 18 remains open while second reset switch 22 is closed during charge redistribution phase 64 with duration Δt;
$M_{lgn}$ is driven with a gate voltage $V_{clamp}$ during the reset and integration phases (66, 68) such that:
  $M_{lgn}$ is off during reset phase 66; and
  $M_{lgn}$ conditionally turns on during integration phase 68; and
$M_{lgn}$ is driven with a full-rail gate voltage (Vdd if $M_{lgn}$ is an NMOS FET) during charge redistribution phase 64 such that $M_{lgn}$ turns on in strong inversion and operates in the linear region as a switch that is closed, thereby forcing $V_{lg}$ and $V_{out}$ to become equal;
$V_{out}$ is sampled a first time just before the end of integration phase 68, this sampling constituting the high-gain (HG) CTIA output; and
$V_{out}$ is sampled a second time just before the end of charge redistribution phase 64, this sampling constituting the low-gain (LG) CTIA output.

The pixel operation during the reset and integration phases (66, 68) in "dynamic low-gain control" mode is essentially identical to the one in "static low-gain control" mode. The following analysis assumes that $I_{ph}$ flows into node 12, $M_{lgn}$ is an NMOS FET and $0<\Delta V<V_t$, where $V_t$ is the NMOS threshold voltage. During reset phase 66, $M_{rst}$ and $M_{lgp}$ are on and $V_{out}$ and $V_{lg}$ are reset to a predetermined voltage. At the onset of integration phase 68, $M_{lgn}$ is off and photocurrent $I_{ph}$ is integrated only on $C_{hg}$. As a result, $V_{out}$ decreases with time with a slope $-I_{ph}/C_{hg}$. When $V_{out}=V_{clamp}-\Delta V$, $M_{lgn}$ turns on in weak inversion and clamps $V_{out}$ to $V_{clamp}-\Delta V$. The HG CTIA output is the value of $V_{out}$ sampled just before the end of integration phase 68. During the charge redistribution phase 64, $M_{lgn}$ is driven with a full-rail gate voltage (Vdd), so that it turns on in strong inversion and operates as a switch that is closed. Consequently, $V_{lg}$ and $V_{out}$ become equal and the integrated charge on $C_{hg}$ and $C_{lg}$ is redistributed. For the duration Δt of the charge redistribution phase, $V_{out}=V_{lg}$ and decreases with time with a slope $-I_{ph}/(C_{hg}+C_{lg})$. The value of $V_{out}$ just before the end of the charge redistribution phase 64 is sampled as the LG CTIA output.

When the CTIA is differential (as shown in FIG. 3a), the predetermined voltage is equal to a voltage $V_{rst}$ applied to the non-inverting input of CTIA amplifier 24, and when the CTIA is single-ended and $I_{ph}$ flows into node 12, the predetermined voltage is approximately a PMOS threshold voltage below supply voltage Vdd. When the CTIA is single-ended and $I_{ph}$ flows out of node 12, the predetermined voltage is preferably set approximately a NMOS threshold voltage above ground.

If $I_{ph}$ flows out of node 12, $M_{lgn}$ is a PMOS FET and $0<\Delta V<|V_t|$, where $V_t$ is the PMOS threshold voltage, the pixel operation is similar to the one described above except that:
$V_{out}$ is reset to a predetermined voltage during reset phase 66 and $V_{out}$ increases with time during integration phase 68;
$M_{lgn}$ is off during integration phase 68 while $V_{out}<V_{clamp}+\Delta V$;
$M_{lgn}$ is on during integration phase 68 while $V_{out}>V_{clamp}+\Delta V$; and
the gate voltage applied to $M_{lgn}$ during charge redistribution phase 64 is equal to ground.

Figure 4:
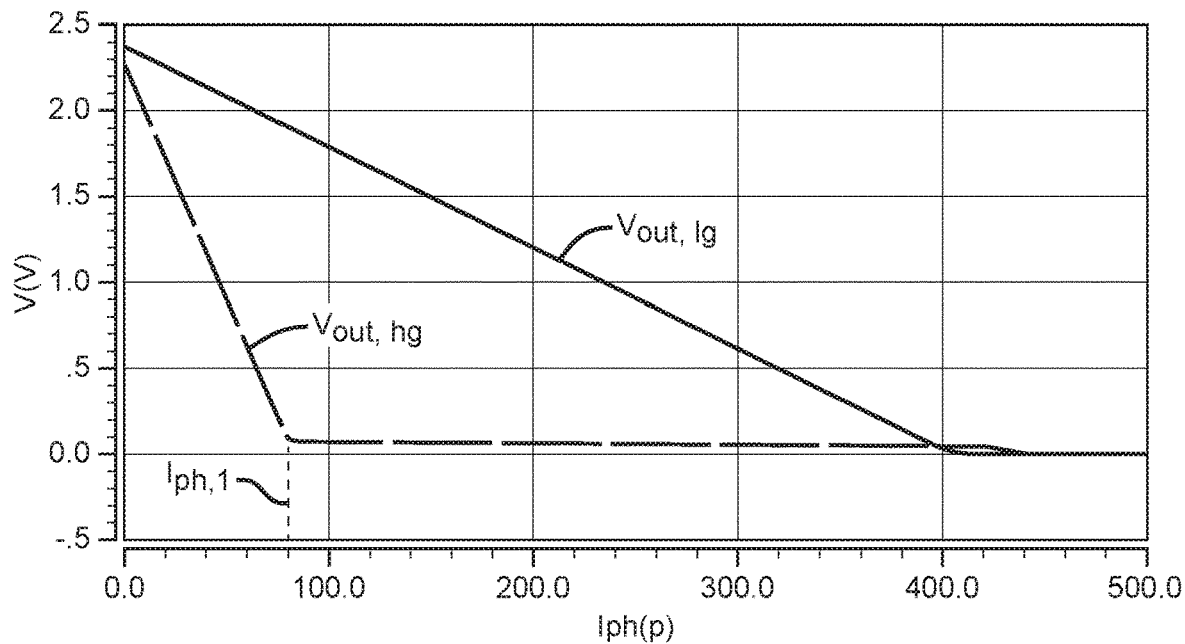

A plot of $V_{out,hg}$ (the HG CTIA output) and $V_{out,lg}$ (the LG CTIA output) versus $I_{ph}$ in "dynamic low-gain control" mode is shown in FIG. 4. $V_{out,hg}$ is given by:

$$V_{out,hg} = V_{rst} - \frac{I_{ph}t_{int}}{C_{hg}} \text{ for } I_{ph} < I_{ph1} \text{ and}$$

$$V_{out,hg} = V_{clamp} - \Delta V = V_{clamp} - \frac{nkT}{q}\ln\frac{I_{ph}}{I_0} \text{ for } I_{ph} \geq I_{ph1}.$$

Here $$I_{ph,1} = \frac{C_{hg}\Delta V_{out}}{t_{int}},$$

where $\Delta V_{out}=V_{rst}-V_{clamp}+\Delta V$. Signal $V_{out,lg}$ is given by:

$$V_{out,lg} = V_{rst} - \frac{I_{ph}(t_{int} + \Delta t)}{C_{hg} + C_{lg}}.$$

As $I_{ph}$ increases further, $V_{out,lg}$ approaches ground and the CTIA pixel saturates. This occurs for approximately 400 pA in FIG. 4. It should be noted that when using dynamic low-gain control it is advantageous to set $V_{clamp}-\Delta V$ close to the CTIA saturation level (ground in FIG. 4) in order to maximize the HG CTIA output swing. While $V_{out,hg}$ decreases logarithmically with $I_{ph}$ for $I_{ph} \geq I_{ph1}$, this region is normally excluded in favor of $V_{out,lg}$ when constructing the HDR signal. It should also be noted that while the $V_{out,lg}$ exposure time ($t_{int}+\Delta t$) is slightly longer than the $V_{out,hg}$ exposure time ($t_{int}$), this difference is inconsequential as long as $\Delta t \ll t_{int}$ and therefore the HDR signal constructed from $V_{out,hg}$ and $V_{out,lg}$ is essentially temporally coherent.

Figure 5B:
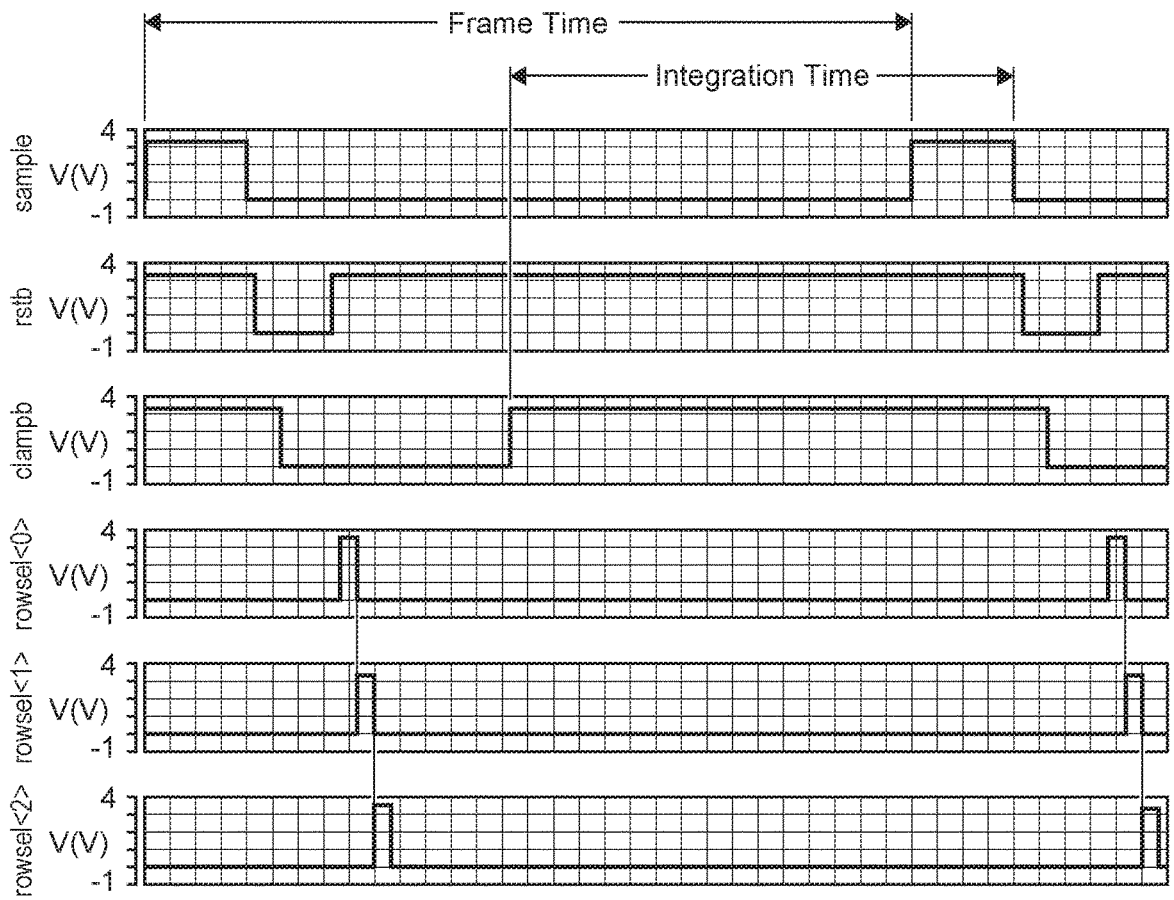
Figure 5A:
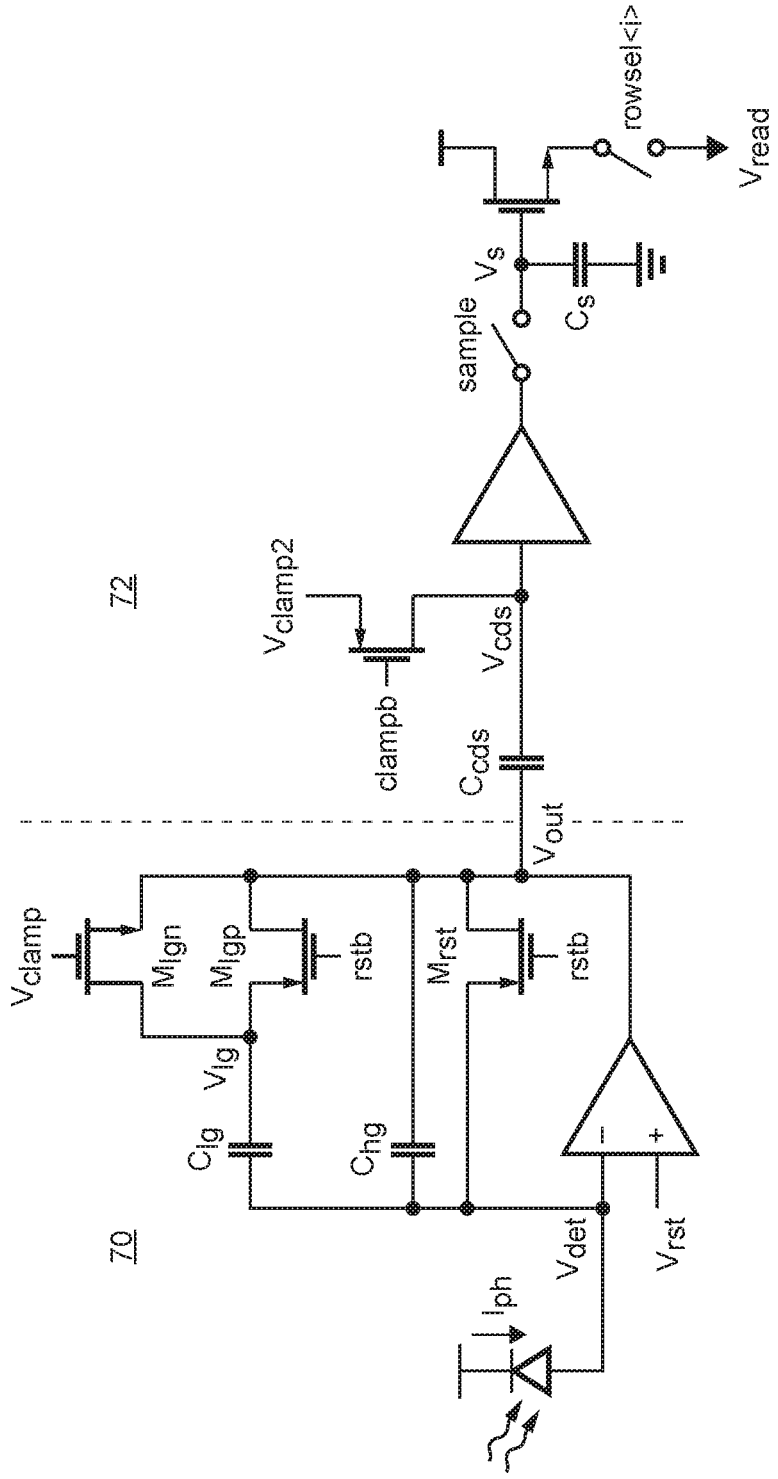
FIG. 5a is a schematic diagram which illustrates coupling a HDR CTIA pixel of FIG. 1a with additional circuitry to provide global shutter, correlated double sampling (CDS), and integrate-while-read (IWR) functionality.
Figure 6A:
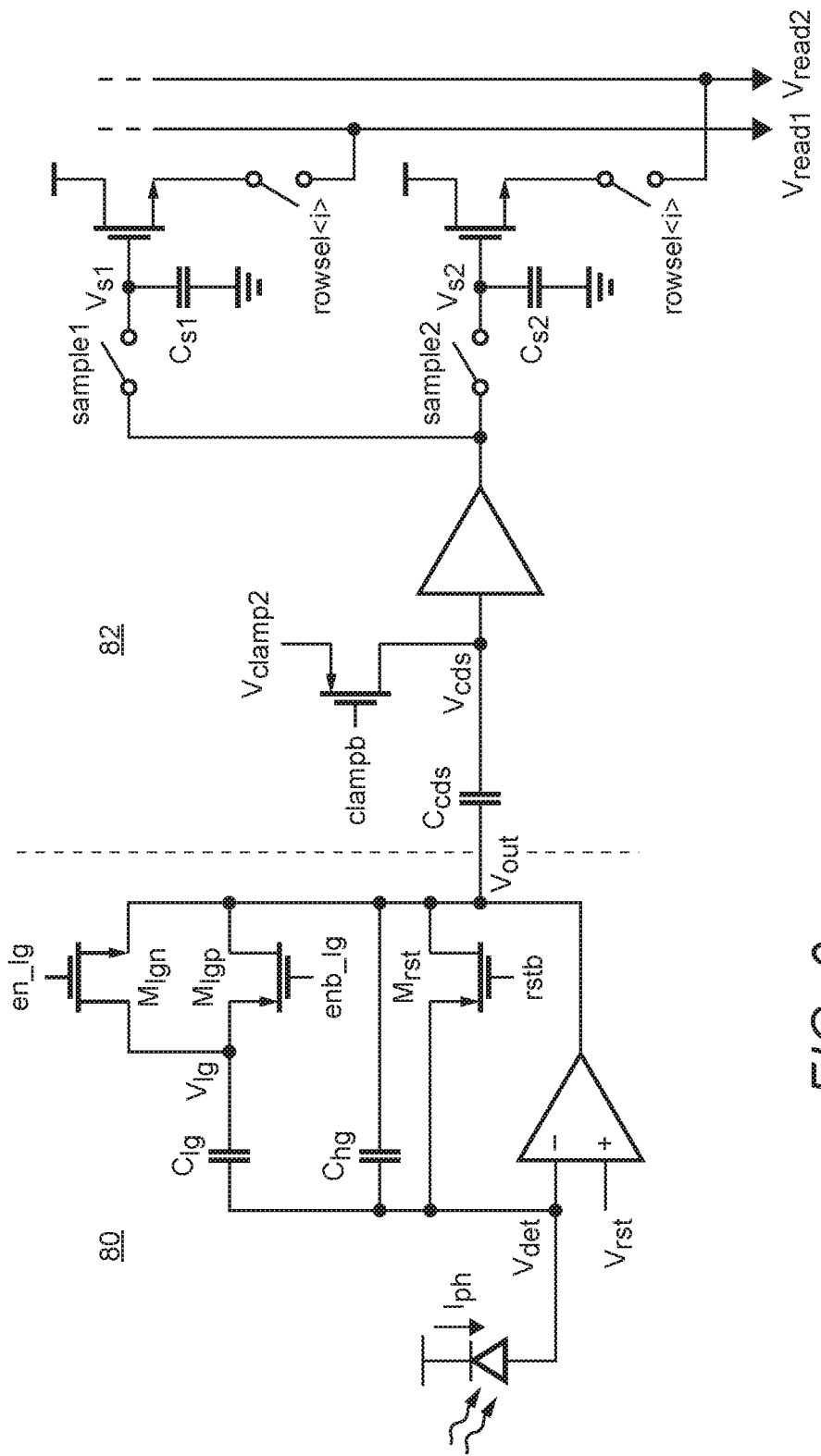
FIG. 6a is a schematic diagram which illustrates coupling a HDR CTIA pixel of FIG. 3a with additional circuitry to provide global shutter, correlated double sampling (CDS), and integrate-while-read (IWR) functionality.
Figure 6B:
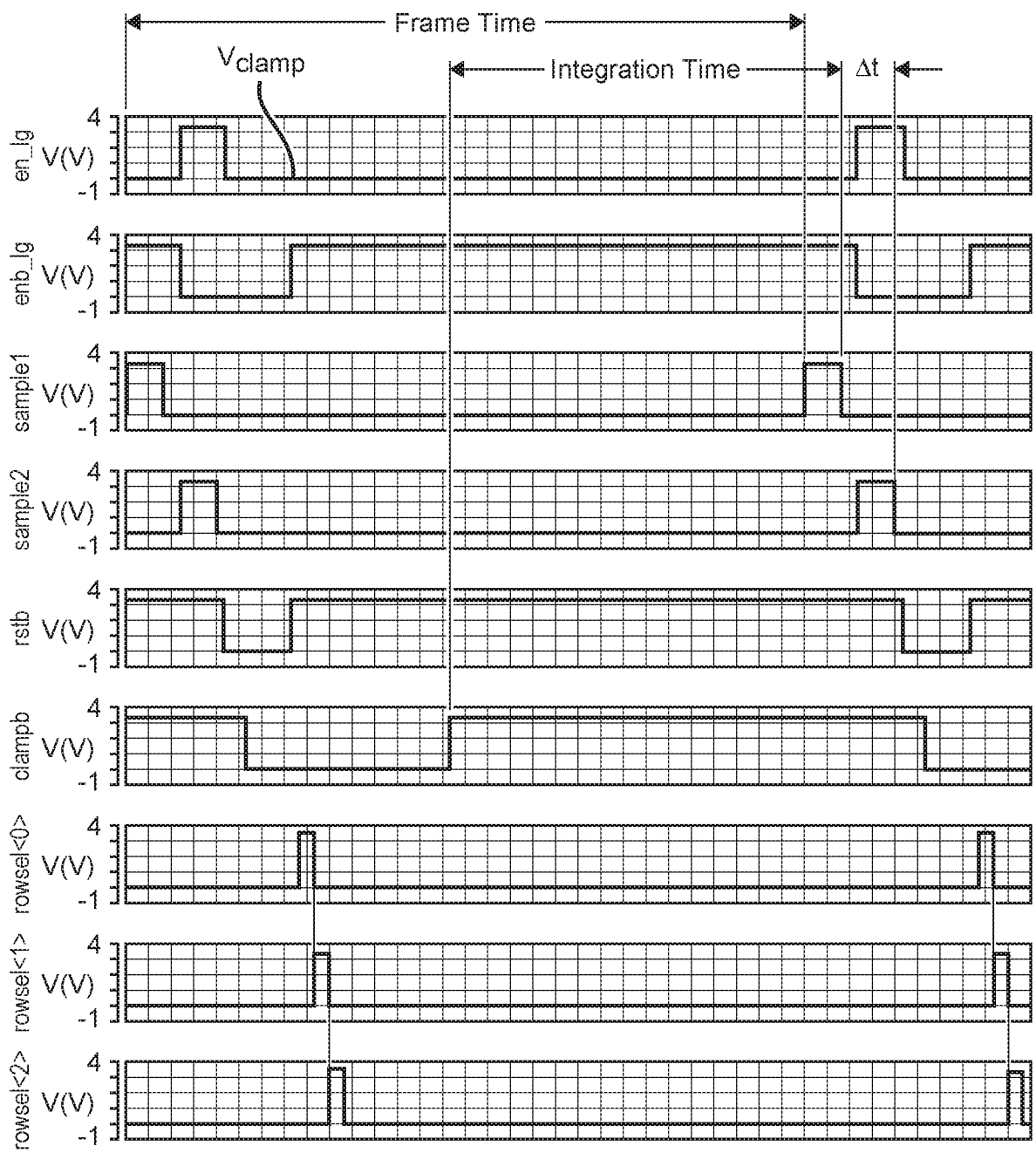

For reference, the following parameters were used in creating the plot shown in FIG. 4:

$C_{hg}$=16 fF
$C_{lg}$=64 fF
$V_{clamp}$=0.5 V
$t_{rst}$=30 µs
$\Delta t$=30 µs
$t_{frame}$=500 µs
$t_{int}$=440 µs The pixels described herein would typically be coupled to additional circuitry to provide a desired functionality. One possible example is shown in FIG. 5a, with a corresponding timing diagram shown in FIG. 5b. Here, a HDR CTIA pixel 70 as described herein is used in "static low-gain control" mode, and coupled to additional circuitry 72 to provide global shutter, correlated double sampling (CDS), and integrate-while-read (IWR) functionality. Similarly, in FIGS. 6a and 6b, a HDR CTIA pixel 80 as described herein is used in "dynamic low-gain control" mode, and coupled to additional circuitry 82 to provide global shutter, CDS and IWR functionality. While FIGS. 5b and 6b illustrate the readout of three pixel rows (by providing consecutive row select signals rowsel<0>, rowsel<1>, and rowsel<2>), an arbitrary number n rows can be read out by providing consecutive row select signals rowsel<0>, rowsel<1>, ... rowsel<n-1>. The last signal rowsel<n-1> must be issued before the arrival of the respective sampling pulse (sample in FIG. 5a, sample1 in FIG. 6a).

The relative advantages and disadvantages of static and dynamic low-gain control will be discussed next. The primary advantage of static low-gain control is that there is a single pixel output (the sampled value of $V_{out}$ at the end of integration) which is an HDR signal containing three different regions (as shown in FIG. 2): a HG linear region, a logarithmic region and a LG linear region. When operated with static low-gain control, the pixel has automatic gain selection; i.e. the pixel output automatically switches between these three regions as the photocurrent increases. Having a single pixel output is advantageous because it simplifies the implementation of additional pixel features such as CDS, global shutter, and IWR functionality. The disadvantage of the static low-gain control is the presence of a logarithmic region, which makes it more difficult to reconstruct a linear transfer function (pixel output vs. photocurrent). Dynamic low-gain control avoids the logarithmic region. Instead, the pixel has two linear outputs: HG and LG as shown in FIG. 4. The absence of a logarithmic region facilitates the reconstruction of a linear transfer function, which represents the main advantage of dynamic low-gain control. The disadvantage is the presence of two pixel outputs, which somewhat complicates the implementation of additional pixel features (CDS, global shutter, IWR, etc.) as can be seen by comparing the schematics in FIGS. 5a and 6a. Another disadvantage is that a pixel operated with dynamic low-gain control by itself does not have automatic gain selection: a separate circuit or block is needed to combine the HG and LG outputs from each pixel into a single HDR output. As an example, the HG output may be compared against a reference to determine whether it is saturated or not. If the HG output is not saturated then the HDR signal equals the HG output; otherwise, the HDR signal equals the LG output. Finally, for the same values of $C_{hg}$, $C_{lg}$ and CTIA output voltage swing, a pixel using dynamic or static low-gain control will have approximately the same dynamic range.

A HDR CTIA pixel as described herein selectively enables an overflow capacitor ($C_{lg}$ in FIGS. 1a and 3a), thereby expanding the pixel's charge capacity and dynamic range. The "static low-gain control" mode further provides automatic gain selection with a single-transistor implementation, which provides minimum layout penalty and no power penalty. The HDR CTIA pixel as described herein preserves spatial coherence because the HDR signal is produced by a single photodiode. It also preserves temporal coherence because the HDR signal is produced by integrating the photocurrent over a single exposure. Both spatial and temporal coherence are particularly beneficial for hyperspectral imaging.

In contrast with a visible monolithic pixel, for the present pixel the photodiode can be on a separate layer and can be made of different semiconductor materials (e.g., Si, HgCdTe, InGaAs). With a suitable selection of photodiode material, the HDR CTIA pixel can work over various spectral bands of interest from UV to long-wave IR. An HDR CTIA pixel with a Si photodiode achieves higher optical fill factor and quantum efficiency (QE) than a visible monolithic pixel, especially in the near-IR spectrum. Pixel crosstalk is also lower, because the CTIA amplifier maintains the CTIA input at a virtual ground and therefore the interpixel capacitance does not matter.

The pixel implementations depicted in FIGS. 1a and 3a are merely exemplary. Numerous ways in which a pixel in accordance with the present invention could be implemented are envisioned, including opposite polarity embodiments and embodiments using devices other than FETs. Similarly, the additional circuitry to which pixels per the present invention might be coupled could be implemented in myriad ways other than those shown in FIGS. 5a and 6a. The present pixel is useful in any number of possible applications, including hyperspectral imaging as mentioned above, or any application needing a HDR CTIA-type input cell.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A pixel having an associated pixel frame period comprising a reset phase followed by an integration phase, comprising:

an input node for connection to the photocurrent output $I_{ph}$ of a photodiode;

an output node, the voltage at said output node being $V_{out}$;

a capacitive transimpedance amplifier (CTIA) which comprises:

a first integration capacitor connected between said input node and said output node; and a first reset switch connected between said input node and said output node;

a second integration capacitor connected between said input node and a first node, the voltage at said first node being $V_{lg}$;

a second reset switch connected between said first node and said output node; and a first FET connected across said second reset switch, said first FET being off during said reset phase and conditionally turning on during or after said integration phase, said first and second reset switches being implemented as FETs of a first polarity and said first FET being implemented as a FET of a second polarity opposite of said first polarity.

2. The pixel of claim 1, wherein said CTIA comprises:
an amplifier having at least an inverting input port and an output port, the inverting input port of said amplifier connected to said input node and the output port of said amplifier connected to
said output node;
said first integration capacitor; and
said first reset switch.

3. The pixel of claim 1, wherein said pixel has an associated pixel saturation level, said pixel frame period arranged such that:
said first and second reset switches are closed during said reset phase;
said first and second reset switches are opened during said integration phase;
said first FET is driven with a DC gate voltage $V_{clamp}$ such that:
said first FET is off during said reset phase; and
said first FET conditionally turns on during said integration phase; and
$V_{out}$ is sampled just before the end of said integration phase.

4. The pixel of claim 3, wherein said pixel saturation level is the voltage at said output node at which the magnitude of the open-loop gain of the feedback loop of said CTIA during said integration phase becomes less than one.

5. The pixel of claim 3, wherein said first FET is an NMOS FET, $V_t$ is the NMOS threshold voltage, and $0<\Delta V<V_t$, said pixel frame period further arranged such that:
$V_{out}$ is reset to a predetermined voltage $V_{rst}$ during said reset phase and decreases with time during said integration phase while $V_{out}>V_{clamp}-\Delta V$;
said first FET is off during said integration phase while $V_{out}>V_{clamp}-\Delta V$; and
said first FET is on during said integration phase while $V_{out}<V_{clamp}-\Delta V$;
wherein $\Delta V$ is equal to the gate-to-source voltage of said first FET when operating in weak inversion.

6. The pixel of claim 5, wherein, when said CTIA is differential, said predetermined voltage is equal to a voltage $V_{rst}$ applied to the non-inverting input of said CTIA amplifier, and when said CTIA is single-ended, said predetermined voltage is approximately a PMOS threshold voltage below the supply voltage Vdd.

7. The pixel of claim 5, wherein said first FET is on during said integration phase and
$V_{out}$ is constant with time and is independent of the value of said first and second integration capacitors and decreases logarithmically with $I_{ph}$ while $V_{out}<V_{lg}$
$V_{out}$ decreases with time and is proportional to $I_{ph}$ and inversely proportional to the sum of said first and second integration capacitors while $V_{out}=V_{lg}$ and $V_{out}$ is higher than said pixel saturation level.

8. The pixel of claim 3, wherein said first FET is a PMOS FET, $V_t$ is the PMOS threshold voltage, and $0<\Delta V<|V_t|$, said pixel frame period further arranged such that:
$V_{out}$ is reset to a predetermined voltage $V_{rst}$ during said reset phase and increases with time during said integration phase while $V_{out}<V_{clamp}+\Delta V$;
said first FET is off during said integration phase while $V_{out}<V_{clamp}+\Delta V$; and
said first FET is on during said integration phase while $V_{out}>V_{clamp}+\Delta V$;
wherein $\Delta V$ is equal to the gate-to-source voltage of said first FET when operating in weak inversion.

9. The pixel of claim 8, wherein, when said CTIA is differential, said predetermined voltage is equal to a voltage $V_{rst}$ applied to the non-inverting input of said CTIA amplifier, and when said CTIA is single-ended, said predetermined voltage is approximately a NMOS threshold voltage above ground.

10. The pixel of claim 8, wherein said first FET is on during said integration phase and
$V_{out}$ is constant with time and is independent of the value of said first and second integration capacitors and increases logarithmically with $I_{ph}$ while $V_{out}>V_{lg}$
$V_{out}$ increases with time and is proportional to $I_{ph}$ and inversely proportional to the sum of said first and second integration capacitors while $V_{out}=V_{lg}$ and $V_{out}$ is lower than said pixel saturation level.

11. The pixel of claim 1, wherein said pixel has an associated pixel saturation level, said pixel frame period further comprising a charge redistribution phase following said integration phase, said pixel frame period arranged such that:
said first and second reset switches are closed during said reset phase;
said first and second reset switches are opened during said integration phase;
said second reset switch is closed during said charge redistribution phase;
said first FET is driven with a gate voltage $V_{clamp}$ during said reset and integration phases such that:
said first FET is off during said reset phase; and
said first FET conditionally turns on during said integration phase; and
said first FET is driven with a full-rail gate voltage during said charge redistribution phase such that said first FET turns on in strong inversion and acts as a switch that is closed, thereby forcing $V_{lg}$ and $V_{out}$ to become equal;
$V_{out}$ is sampled a first time just before the end of the integration phase, this sampling constituting the high-gain CTIA output; and
$V_{out}$ is sampled a second time just before the end of the charge redistribution phase, this sampling constituting the low-gain CTIA output.

12. The pixel of claim 11, wherein said pixel saturation level is the voltage at said output node at which the magnitude of the open-loop gain of the feedback loop of said CTIA during said integration or charge redistribution phases becomes less than one.

13. The pixel of claim 11, wherein said first FET is an NMOS FET, $V_t$ is the NMOS threshold voltage, and $0<\Delta V<V_t$, said pixel frame period further arranged such that:
$V_{out}$ is reset to a predetermined voltage $V_{rst}$ during said reset phase and $V_{out}$ decreases with time during said integration phase while $V_{out}>V_{clamp}-\Delta V$;
said first FET is off during said integration phase while $V_{out}>V_{clamp}-\Delta V$;
said first FET is on during said integration phase while $V_{out}<V_{clamp}-\Delta V$; and
the gate voltage applied to said first FET during said charge redistribution phase is equal to the supply voltage Vdd;

wherein $\Delta V$ is equal to the gate-to-source voltage of said first FET when operating in weak inversion.

14. The pixel of claim 13, wherein, when said CTIA is differential, said predetermined voltage is equal to a voltage $V_{rst}$ applied to the non-inverting input of said CTIA amplifier, and when said CTIA is single-ended, said predetermined voltage is approximately a PMOS threshold voltage below the supply voltage Vdd.

15. The pixel of claim 11, wherein said first FET is a PMOS FET, $V_t$ is the PMOS threshold voltage, and $0<\Delta V<|V_t|$, said pixel frame period further arranged such that:
- $V_{out}$ is reset to a predetermined voltage $V_{rst}$ during said reset phase and $V_{out}$ increases with time during said integration phase while $V_{out}<V_{clamp}+\Delta V$;
- said first FET is off during said integration phase while $V_{out}<V_{clamp}+\Delta V$;
- said first FET is on during said integration phase while $V_{out}>V_{clamp}+\Delta V$; and
- the gate voltage applied to said first FET during said charge redistribution phase is equal to ground;
- wherein $\Delta V$ is equal to the gate-to-source voltage of said first FET when operating in weak inversion.

16. The pixel of claim 15, wherein, when said CTIA is differential, said predetermined voltage is equal to a voltage $V_{rst}$ applied to the non-inverting input of said CTIA amplifier, and when said CTIA is single-ended, said predetermined voltage is approximately a NMOS threshold voltage above ground.

17. A pixel having an associated pixel frame period comprising a reset phase followed by an integration phase, comprising:
- an input node for connection to the photocurrent output $I_{ph}$ of a photodiode;
- an output node, the voltage at said output node being $V_{out}$;
- a capacitive transimpedance amplifier (CTIA), comprising:
  - an amplifier having at least an inverting input port and an output port, the inverting input port of said amplifier connected to said input node and the output port of said amplifier connected to said output node;
  - a first integration capacitor connected between said input node and said output node; and
  - a first reset switch connected between said input node and said output node;
- a second integration capacitor connected between said input node and a first node, the voltage at said first node being $V_{lg}$;
- a second reset switch connected between said first node and said output node; and
- a first FET connected across said second reset switch and driven with a DC voltage $V_{clamp}$;
- wherein said pixel has an associated pixel saturation level, said pixel frame period arranged such that:
  - said first and second reset switches are closed during said reset phase;
  - said first and second reset switches are opened during said integration phase;
  - said first FET is driven with a DC gate voltage $V_{clamp}$ such that:
    - said first FET is off during said reset phase; and
    - said first FET conditionally turns on during said integration phase; and
  - $V_{out}$ is sampled just before the end of said integration phase.

18. The pixel of claim 17, wherein said pixel saturation level is the voltage at said output node at which the magnitude of the open-loop gain of the feedback loop of said CTIA during said integration phase becomes less than one.

19. The pixel of claim 17, wherein said first FET is an NMOS FET, $V_t$ is the NMOS threshold voltage, and $0<\Delta V<V_t$, said pixel frame period further arranged such that:
- $V_{out}$ is reset to a predetermined voltage $V_{rst}$ during said reset phase and decreases with time during said integration phase while $V_{out}>V_{clamp}-\Delta V$;
- said first FET is off during said integration phase while $V_{out}>V_{clamp}-\Delta V$; and
- said first FET is on during said integration phase while $V_{out}<V_{clamp}-\Delta V$;
- wherein $\Delta V$ is equal to the gate-to-source voltage of said first FET when operating in weak inversion.

20. The pixel of claim 19, wherein, when said CTIA is differential, said predetermined voltage is equal to a voltage $V_{rst}$ applied to the non-inverting input of said CTIA amplifier, and when said CTIA is single-ended, said predetermined voltage is approximately a PMOS threshold voltage below the supply voltage Vdd.

21. The pixel of claim 17, wherein said first FET is a PMOS FET, $V_t$ is the PMOS threshold voltage, and $0<\Delta V<|V_t|$, said pixel frame period further arranged such that:
- $V_{out}$ is reset to a predetermined voltage $V_{rst}$ during said reset phase and increases with time during said integration phase while $V_{out}<V_{clamp}+\Delta V$;
- said first FET is off during said integration phase while $V_{out}<V_{clamp}+\Delta V$; and
- said first FET is on during said integration phase while $V_{out}>V_{clamp}+\Delta V$;
- wherein $\Delta V$ is equal to the gate-to-source voltage of said first FET when operating in weak inversion.

22. The pixel of claim 21, wherein, when said CTIA is differential, said predetermined voltage is equal to a voltage $V_{rst}$ applied to the non-inverting input of said CTIA amplifier, and when said CTIA is single-ended, said predetermined voltage is approximately a NMOS threshold voltage above ground.

23. The pixel of claim 19, wherein $V_{out}$ at the end of integration is given by:

$$V_{out} = V_{rst} - \frac{I_{ph}t_{int}}{C_{hg}}$$

when $I_{ph}$ is less than a first value;

$$V_{out} = V_{clamp} - \Delta V = V_{clamp} - \frac{nkT}{q}\ln\frac{I_{ph}}{I_0}$$

when $I_{ph}$ is between said first value and a second value; and $$V_{out} = V_{rst} - \frac{I_{ph}t_{int}}{C_{hg} + C_{lg}}$$

when $I_{ph}$ is greater than said second value and $V_{out}$ is higher than said pixel saturation level where k is Boltzmann's constant, T is absolute temperature, q is the charge of the electron, n is a non-ideality factor, $I_0$ is current proportional to W/L of said first FET, $C_{hg}$ is the capacitance of said first integration capacitor, $C_{lg}$ is the capacitance of said second integration capacitor, and $T_{int}$ is the duration of said integration phase.

24. The pixel of claim 21, wherein $V_{out}$ at the end of integration is given by:

$$V_{out} = V_{rst} + \frac{I_{ph}t_{int}}{C_{hg}}$$

when $I_{ph}$ is less than a first value;

$$V_{out} = V_{clamp} + \Delta V = V_{clamp} + \frac{nkT}{q}\ln\frac{I_{ph}}{I_0}$$

when $I_{ph}$ is between said first value and a second value; and $$V_{out} = V_{rst} + \frac{I_{ph}t_{int}}{C_{hg} + C_{lg}}$$

when $I_{ph}$ is greater than said second value and $V_{out}$ is lower than said pixel saturation level where k is Boltzmann's constant, T is absolute temperature, q is the charge of the electron, n is a non-ideality factor, $I_0$ is current proportional to W/L of said first FET, $C_{hg}$ is the capacitance of said first integration capacitor, $C_{lg}$ is the capacitance of said second integration capacitor, and $T_{int}$ is the duration of said integration phase.

25. A pixel having an associated pixel frame period comprising a reset phase followed by an integration phase and a charge redistribution phase, comprising:
    an input node for connection to the photocurrent output $I_{ph}$ of a photodiode;
    an output node, the voltage at said output node being $V_{out}$;
    a capacitive transimpedance amplifier (CTIA), comprising:
        an amplifier having at least an inverting input port and an output port, the inverting input port of said amplifier connected to said input node and the output port of said amplifier connected to said output node;
        a first integration capacitor connected between said input node and said output node; and
        a first reset switch connected between said input node and said output node;
    a second integration capacitor connected between said input node and a first node, the voltage at said first node being $V_{lg}$;
    a second reset switch connected between said first node and said output node; and
    a first FET connected across said second reset switch and driven with a drive voltage $V_{en\_lg}$;
    wherein said pixel has an associated pixel saturation level, said pixel frame period arranged such that:
        said first and second reset switches are closed during said reset phase;
        said first and second reset switches are opened during said integration phase;
        said second reset switch is closed during said charge redistribution phase;
        said first FET is driven with a gate voltage $V_{clamp}$ during said reset and integration phases such that:
            said first FET is off during said reset phase; and said first FET conditionally turns on during said integration phase; and
said first FET is driven with a full-rail gate voltage during said charge redistribution phase such that said first FET turns on in strong inversion and acts as a switch that is closed, thereby forcing $V_{lg}$ and $V_{out}$ to become equal;
$V_{out}$ is sampled a first time just before the end of the integration phase, this sampling constituting the high-gain CTIA output; and
$V_{out}$ is sampled a second time just before the end of the charge redistribution phase, this sampling constituting the low-gain CTIA output.

26. The pixel of claim 25, wherein said pixel saturation level is the voltage at said output node at which the magnitude of the open-loop gain of the feedback loop of said CTIA during said integration phase becomes less than one.

27. The pixel of claim 25, wherein said first FET is an NMOS FET, $V_t$ is the NMOS threshold voltage, and $0<\Delta V<V_t$, said pixel frame period further arranged such that:
    $V_{out}$ is reset to a predetermined voltage $V_{rst}$ during said reset phase and decreases with time during said integration phase while $V_{out}>V_{clamp}-\Delta V$;
    said first FET is off during said integration phase while $V_{out}>V_{clamp}-\Delta V$; and
    said first FET is on during said integration phase while $V_{out}<V_{clamp}-\Delta V$;
    wherein $\Delta V$ is equal to the gate-to-source voltage of said first FET when operating in weak inversion.

28. The pixel of claim 27, wherein, when said CTIA is differential, said predetermined voltage is equal to a voltage $V_{rst}$ applied to the non-inverting input of said CTIA amplifier, and when said CTIA is single-ended, said predetermined voltage is approximately a PMOS threshold voltage below the supply voltage Vdd.

29. The pixel of claim 25, wherein said first FET is a PMOS FET, $V_t$ is the PMOS threshold voltage, and $0<\Delta V<|V_t|$, said pixel frame period further arranged such that:
    $V_{out}$ is reset to a predetermined voltage $V_{rst}$ during said reset phase and increases with time during said integration phase while $V_{out}<V_{clamp}+\Delta V$;
    said first FET is off during said integration phase while $V_{out}<V_{clamp}+\Delta V$; and
    said first FET is on during said integration phase while $V_{out}>V_{clamp}+\Delta V$;
    wherein $\Delta V$ is equal to the gate-to-source voltage of said first FET when operating in weak inversion.

30. The pixel of claim 29, wherein, when said CTIA is differential, said predetermined voltage is equal to a voltage $V_{rst}$ applied to the non-inverting input of said CTIA amplifier, and when said CTIA is single-ended, said predetermined voltage is approximately a NMOS threshold voltage above ground.

31. The pixel of claim 27, wherein said high-gain CTIA output is given by:

$$V_{out,hg} = V_{rst} - \frac{I_{ph}t_{int}}{C_{hg}}$$

when $I_{ph}$ is less than a first value $$V_{out,hg} = V_{clamp} - \Delta V = V_{clamp} - \frac{nkT}{q}\ln\frac{I_{ph}}{I_0}$$

when $I_{ph}$ is greater than said first value;
and said low-gain CTIA output is given by:

$$V_{out,lg} = V_{rst} - \frac{I_{ph}(t_{int} + \Delta t)}{C_{hg} + C_{lg}}$$

when $V_{out,lg}$ is higher than said pixel saturation level; where k is Boltzmann's constant, T is absolute temperature, q is the charge of the electron, n is a non-ideality factor, $I_0$ is current proportional to W/L of said first FET, $C_{hg}$ is the capacitance of said first integration capacitor, $C_{lg}$ is the capacitance of said second integration capacitor, $T_{int}$ is the duration of said integration phase, and $\Delta t$ is the duration of said redistribution phase.

32. The pixel of claim 29, wherein said high-gain CTIA output is given by:

$$V_{out,hg} = V_{rst} + \frac{I_{ph}t_{int}}{C_{hg}}$$

when $I_{ph}$ is less than a first value $$V_{out,hg} = V_{clamp} + \Delta V = V_{clamp} + \frac{nkT}{q}\ln\frac{I_{ph}}{I_0}$$

when $I_{ph}$ is greater than said first value;
and said low-gain CTIA output is given by:

$$V_{out,lg} = V_{rst} + \frac{I_{ph}(t_{int} + \Delta t)}{C_{hg} + C_{lg}}$$

when $V_{out,lg}$ is lower than said pixel saturation level where k is Boltzmann's constant, T is absolute temperature, q is the charge of the electron, n is a non-ideality factor, $I_0$ is current proportional to W/L of said first FET, $C_{hg}$ is the capacitance of said first integration capacitor, $C_{lg}$ is the capacitance of said second integration capacitor, $T_{int}$ is the duration of said integration phase, and $\Delta t$ is the duration of said redistribution phase.

* * * * *